United States Patent
Aoyama et al.

(10) Patent No.: US 12,256,491 B2
(45) Date of Patent: Mar. 18, 2025

(54) ELECTRONIC COMPONENT MOUNTING SUBSTRATE, ELECTRONIC COMPONENT MOUNTED BODY, AND METHOD OF MANUFACTURING THE SAME, AS WELL AS ELECTRONIC APPARATUS

(71) Applicant: SONY GROUP CORPORATION, Tokyo (JP)

(72) Inventors: Koji Aoyama, Aichi (JP); Naoto Sasaki, Aichi (JP)

(73) Assignee: Sony Group Corporation, Tokyo (JP)

( * ) Notice: Subject to any disclaimer, the term of this patent is extended or adjusted under 35 U.S.C. 154(b) by 149 days.

(21) Appl. No.: 17/779,359

(22) PCT Filed: Dec. 1, 2020

(86) PCT No.: PCT/JP2020/044654
§ 371 (c)(1),
(2) Date: May 24, 2022

(87) PCT Pub. No.: WO2021/112073
PCT Pub. Date: Jun. 10, 2021

(65) Prior Publication Data
US 2022/0408560 A1    Dec. 22, 2022

(30) Foreign Application Priority Data
Dec. 4, 2019    (JP) .................. 2019-219800

(51) Int. Cl.
*H05K 1/11*    (2006.01)
*H05K 1/18*    (2006.01)
(Continued)

(52) U.S. Cl.
CPC ............ *H05K 1/111* (2013.01); *H05K 1/181* (2013.01); *H05K 3/0032* (2013.01); *H05K 3/027* (2013.01);
(Continued)

(58) Field of Classification Search
CPC .................. H05K 1/111; H05K 1/181; H05K 2201/09381; H05K 2201/10015;
(Continued)

(56) References Cited

U.S. PATENT DOCUMENTS

| 6,115,262 A | 9/2000 | Brunner |
| 2003/0011999 A1 | 1/2003 | Urakawa |

(Continued)

FOREIGN PATENT DOCUMENTS

| JP | 2001-057467 | 2/2001 |
| JP | 2001-068841 | 3/2001 |

(Continued)

OTHER PUBLICATIONS

International Search Report and Written Opinion prepared by the Japan Patent Office on Feb. 17, 2021, for International Application No. PCT/JP2020/044654, 2 pgs.

*Primary Examiner* — Hoa C Nguyen
(74) *Attorney, Agent, or Firm* — Sheridan Ross PC

(57) ABSTRACT

An electronic component mounted body includes a substrate, a connection section provided on the substrate, an electronic component having a terminal connected to the connection section, and a solder that fixes the electronic component to the connection section. The connection section has a first region in which the terminal is fixed through the solder, and a second region lower in wettability than the first region, and the second region has an extension region extended to a peripheral edge of the connection section, and a spaced region that projects from the extension region toward the first region and that is provided to be spaced from the peripheral edge.

20 Claims, 11 Drawing Sheets

(51) Int. Cl.
  *H05K 3/00*  (2006.01)
  *H05K 3/02*  (2006.01)
  *H05K 3/34*  (2006.01)

(52) U.S. Cl.
  CPC ......... *H05K 3/3442* (2013.01); *H05K 3/3494* (2013.01); *H05K 2201/09381* (2013.01); *H05K 2201/10015* (2013.01); *H05K 2201/10022* (2013.01); *H05K 2201/1003* (2013.01); *H05K 2201/10037* (2013.01); *H05K 2201/10166* (2013.01); *H05K 2201/10174* (2013.01); *H05K 2203/107* (2013.01)

(58) Field of Classification Search
  CPC . H05K 2201/10022; H05K 2201/1003; H05K 2201/10037; H05K 2201/10166; H05K 2201/10174
  See application file for complete search history.

(56) References Cited

U.S. PATENT DOCUMENTS

| | | | |
|---|---|---|---|
| 2007/0080449 A1* | 4/2007 | Kurita | H05K 3/3452 |
| | | | 257/734 |
| 2015/0216054 A1* | 7/2015 | Standing | H01L 25/072 |
| | | | 228/180.21 |
| 2015/0223334 A1* | 8/2015 | Nakagawa | H01G 4/12 |
| | | | 174/258 |
| 2015/0250047 A1* | 9/2015 | Nambu | H05K 3/3442 |
| | | | 174/254 |
| 2017/0042029 A1* | 2/2017 | Nishimura | H01G 2/06 |

FOREIGN PATENT DOCUMENTS

| | | |
|---|---|---|
| JP | 2006-086453 | 3/2006 |
| JP | 2009218280 A | 9/2009 |
| JP | 2014-187394 | 10/2014 |

* cited by examiner

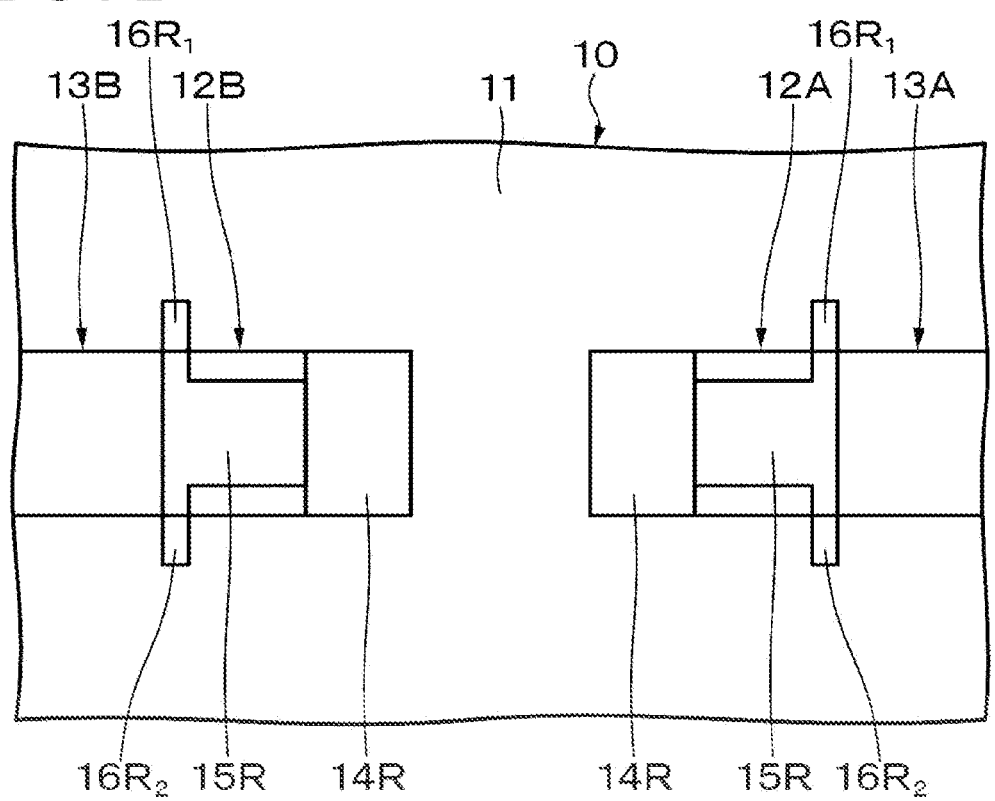

ELECTRONIC COMPONENT MOUNTING SUBSTRATE, ELECTRONIC COMPONENT MOUNTED BODY, AND METHOD OF MANUFACTURING THE SAME, AS WELL AS ELECTRONIC APPARATUS

CROSS REFERENCE TO RELATED APPLICATIONS

This application is a national stage application under 35 U.S.C. 371 and claims the benefit of PCT Application No. PCT/JP2020/044654, having an international filing date of 1 Dec. 2020, which designated the United States, which PCT application claimed the benefit of Japanese Patent Application No. 2019-219800, filed 4 Dec. 2019, the entire disclosures of each of which are incorporated herein by reference.

TECHNICAL FIELD

The present disclosure relates to an electronic component mounting substrate, an electronic component mounted body, and a method of manufacturing the same, as well as an electronic apparatus including the same.

BACKGROUND ART

There has been known a technology in which, for preventing wetting and spreading of solder on a conductor pattern, laser processing is conducted in such a manner as to completely separate the conductor pattern, thereby forming a low-solder-wettability region (see, for example, PTL 1).

CITATION LIST

Patent Literature

[PTL 1]
  JP 2006-86453A

SUMMARY

Technical Problems

However, since positional accuracy of laser processing is present, when the above-mentioned technology is applied to an MID (Molded Interconnect Device) or the like, simultaneous processing of a ground resin of the conductor pattern is inevitable.

When the ground resin is laser processed, the quality of soldering may be lowered. The lowering in the quality is considered to arise from the following points (1) to (3). (1) At the time of applying a solder such as a solder paste, a solvent component including flux enters the laser processed portion by a capillary phenomenon, whereby active force at the time of soldering bonding is deprived. (2) A damage (line breakage and cracking due to stress, and their influence on the conductor pattern) is given to the conductor pattern by processing of the ground resin in the surroundings of the conductor pattern. (3) Defective bonding is generated at the time of soldering due to an insulating resin foreign matter.

It is an object of the present disclosure to provide an electronic component mounting substrate capable of preventing lowering in quality of soldering, an electronic component mounted body, and a method of manufacturing the same, as well as an electronic apparatus including the same.

Solution to Problems

In order to solve the above-mentioned problems, a first disclosure is an electronic component mounted body including a substrate, a connection section provided on the substrate, an electronic component having a terminal connected to the connection section, and a solder that fixes the electronic component to the connection section, in which the connection section has a first region in which the terminal is fixed by the solder, and a second region lower in wettability than the first region, and, in which the second region has an extension region extended to a peripheral edge of the connection section, and a spaced region that projects from the extension region toward the first region and that is provided to be spaced from the peripheral edge.

A second disclosure is an electronic apparatus including an electronic component mounted body of the first disclosure.

A third disclosure is an electronic component mounting substrate including a substrate, and a connection section provided on the substrate, in which the connection section has a first region in which a terminal is fixed by a solder, and a second region lower in wettability than the first region, and the second region has an extension region extended to a peripheral edge of the connection section, and a spaced region that projects from the extension region toward the first region and that is provided to be spaced from the peripheral edge.

A fourth disclosure is a method of manufacturing an electronic component mounted body, the method including removing part of a first metallic layer by laser processing to expose a second metallic layer lower in wettability than the first metallic layer, thereby forming, on a substrate, a connection section that has a first region in which the first metallic layer is exposed and a second region in which the second metallic layer is exposed, in which the second region has an extension region extended to a peripheral edge of the connection section, and a spaced region that projects from the extension region toward the first region and that is provided to be spaced from the peripheral edge.

BRIEF DESCRIPTION OF DRAWINGS

FIG. 2 is a plan view depicting an example of a configuration of an electronic component mounting substrate.

DESCRIPTION OF EMBODIMENTS

Embodiments of the present disclosure will be described in the following order with reference to the drawings. Note that, in all the drawings in the following embodiments, the same or corresponding parts are denoted by the same reference signs.

1 First Embodiment (Example of Electronic Component Mounted Body)
2 Second Embodiment (Example of Electronic Component Mounted Body)
3 Third Embodiment (Example of Electronic Component Mounted Body)
4 Modifications
5 Application Examples

1 First Embodiment

[Configuration of Electronic Component Mounted Body]

Figure 1A:
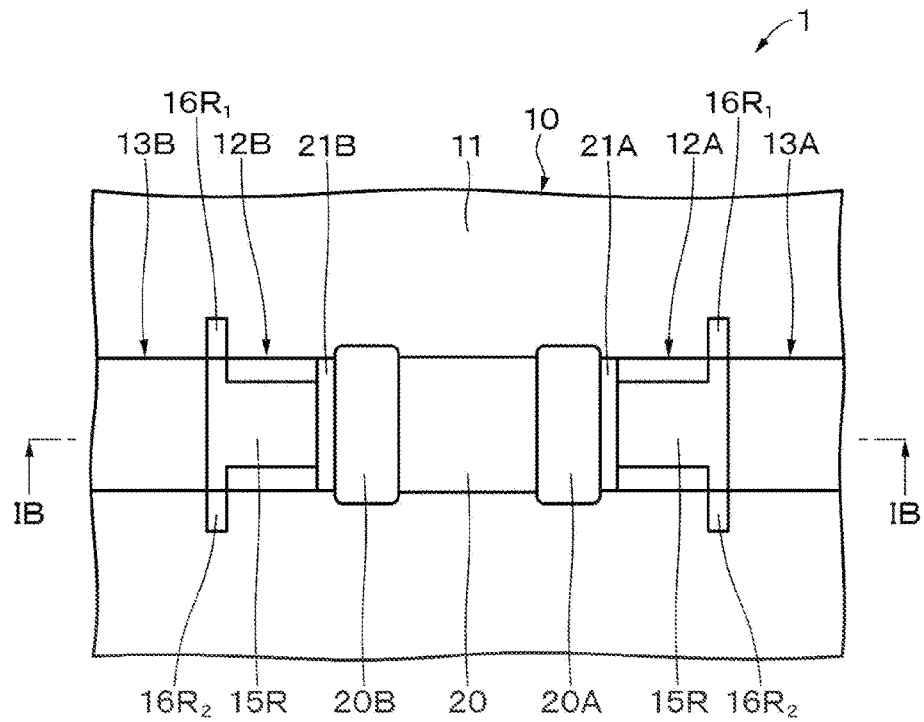
FIG. 1A is a plan view depicting an example of a configuration of an electronic component mounted body according to a first embodiment of the present disclosure.
Figure 1B:
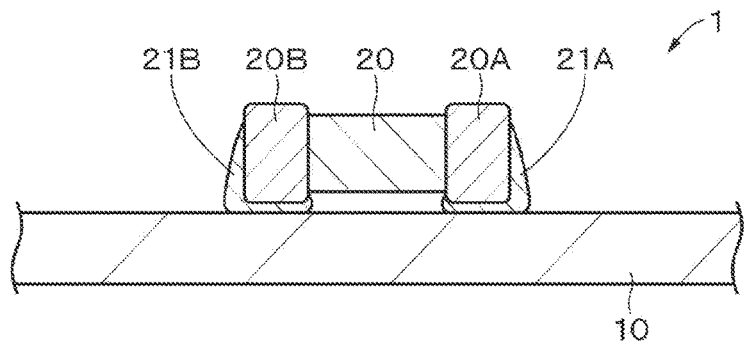
FIG. 1B is a sectional view taken along line IB-IB of FIG. 1A.

FIG. 1A is a plan view depicting an example of the configuration of an electronic component mounted body 1 according to a first embodiment of the present disclosure. FIG. 1B is a sectional view taken along line IB-IB of FIG. 1A. The electronic component mounted body 1 includes an electronic component mounting substrate 10, an electronic component 20, and solders 21A and 21B. The electronic component mounted body 1 may be an MID (Molded Interconnect Device).

(Electronic Component)

The electronic component 20 has a connection terminal (first connection terminal) 20A and a connection terminal (second connection terminal) 20B. The connection terminal 20A and the connection terminal 20B have different polarities. For example, the connection terminal 20A is a positive terminal, and the connection terminal 20B is a negative terminal. The electronic component may have a chip-like shape or may have a shape other than the chip-like shape. As the electronic component, there may be mentioned, for example, a capacitor a battery, a resistor, a coil, a diode, a transistor, or a switch, but the electronic component is not limited to these electronic components. In FIG. 1A, an example in which the electronic component 20 is a chip-like capacitor is depicted.

(Electronic Component Mounting Substrate)

Figure 3A:
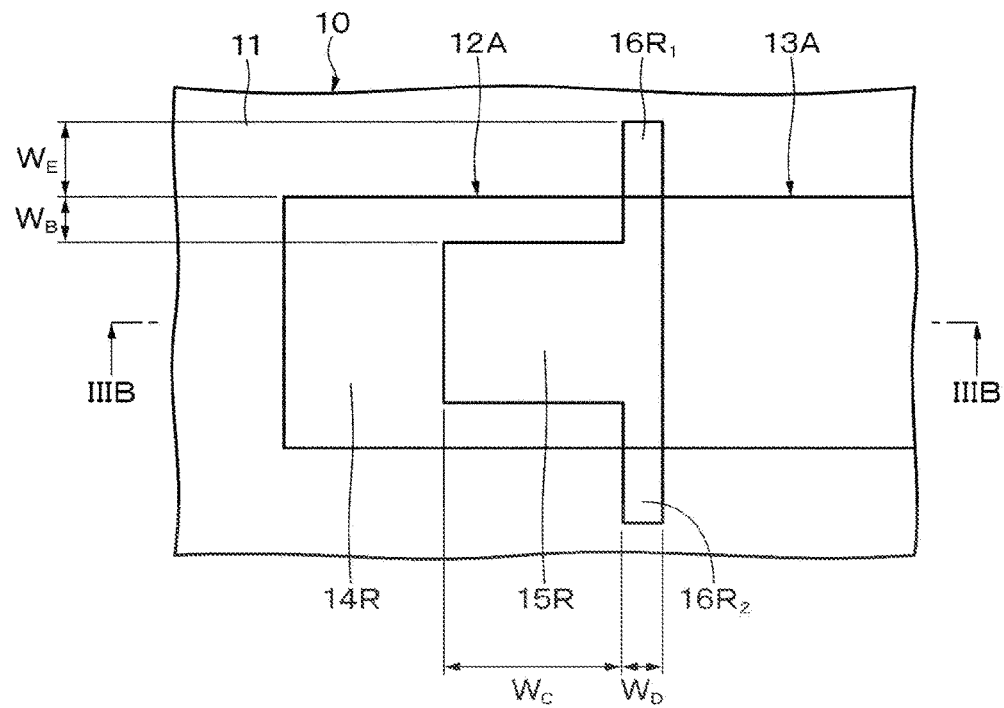
FIG. 3A is a plan view depicting, in an enlarged manner, a part of FIG. 2.
Figure 3B:
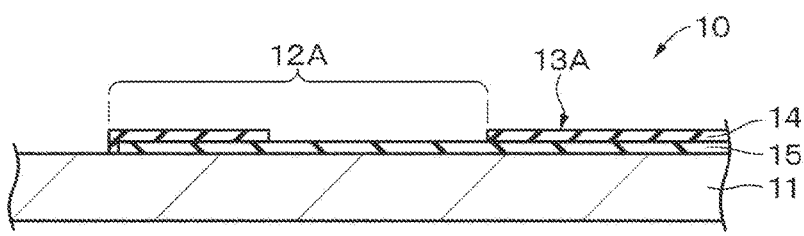
FIG. 3B is a sectional view taken along line IIIB-IIIB of FIG. 3A.

FIG. 2 is a plan view depicting an example of the configuration of an electronic component mounting substrate 10. FIG. 3A is a plan view depicting, in an enlarged manner a part of FIG. 2. FIG. 3B is a sectional view taken along line IIIB-IIIB of FIG. 3A. The electronic component mounting substrate 10 includes a substrate main body 11, a pair of connection sections 12A and 12B, and conductor patterns 13A and 13B.

(Substrate Main Body)

The substrate main body 11 supports the electronic component 20. The substrate main body 11 includes a polymeric resin on at least a surface thereof. The substrate main body 11 may be a resin molded body including a polymeric resin. The resin molded body may be a housing used for an electronic apparatus or the like. While an example in which the substrate main body 11 is shapes like a flat plate is depicted in FIGS. 1A, 1B, 2, and 3, the shape of the substrate main body 11 is not limited to this. The substrate main body 11 may be a molded body having a three-dimensional structure (for example, an injection molded body having a three-dimensional structure).

(Connection Section)

The connection sections 12A and 12B are what are generally called lands. The connection sections 12A and 12B are provided on the substrate main body 11. The electronic component 20 is connected to the connection sections 12A and 12B. Specifically, the connection terminal 20A of the electronic component 20 is connected to the connection section 12A, and the connection terminal 20B of the electronic component 20 is connected to the connection section 12B. The connection section 12A and the connection terminal 20B are fixed by the solder 21A, and the connection section 12B and the connection terminal 20B are fixed by the solder 21B. The connection sections 12A and 12B have a width similar to that of the conductor patterns 13A and 13B. The connection sections 12A and 12B have a rectangular shape. It is to be noted, however, that the shape of the connection sections 12A and 12B is not limited to the rectangular shape and may be a circular shape, an elliptic shape, or a polygonal shape other than the rectangular shape, or the like.

As depicted in FIG. 3B, the connection sections 12A and 12B include a high-wettability metallic layer (first metallic layer) 14 and a low-wettability metallic layer (second metallic layer) 15. The wettability of the low-wettability metallic layer 15 is lower than the wettability of the high-wettability metallic layer 14. Therefore, a solder is less likely to spread on the low-wettability metallic layer 15 than on the high-wettability metallic layer 14. The low-wettability metallic layer 15 is provided under the high-wettability metallic layer 14. The low-wettability metallic layer 15 is provided on a surface of the substrate main body 11. The high-wettability metallic layer 14 includes, for example, gold (Au), a gold alloy, silver (Ag), or a silver alloy. The low-wettability metallic layer 15 includes, for example, nickel (Ni), a nickel alloy, copper (Cu), or a copper alloy.

The pair of connection sections 12A and 12B are disposed to face each other with a prescribed distance therebetween. As depicted in FIGS. 2 and 3A, the connection section 12A has a high-wettability region (first region) 14R and a low-wettability region (second region) 15R on the side of the surface of the substrate main body 11. The connection section 12B also has another high-wettability region 14R and another low-wettability region 15R on the side of the surface of the substrate main body 11.

(High-Wettability Region)

The contact angle of the solder on the high-wettability region 14R is preferably substantially 0 degrees. When the contact angle of the solder is substantially 0 degrees, a function excellent as the high-wettability region 14R can be obtained. Here, the substantially 0 degrees include 0 degrees. The contact angle of the solder on the high-wettability region 14R is measured as follows. A solder (solder composition: SAC305) is applied to the high-wettability region 14R such that the solder application diameter ϕ is 0.3 mm, and, after melting the solder by reflow, the contact angle of the solder is measured.

Figure 4:
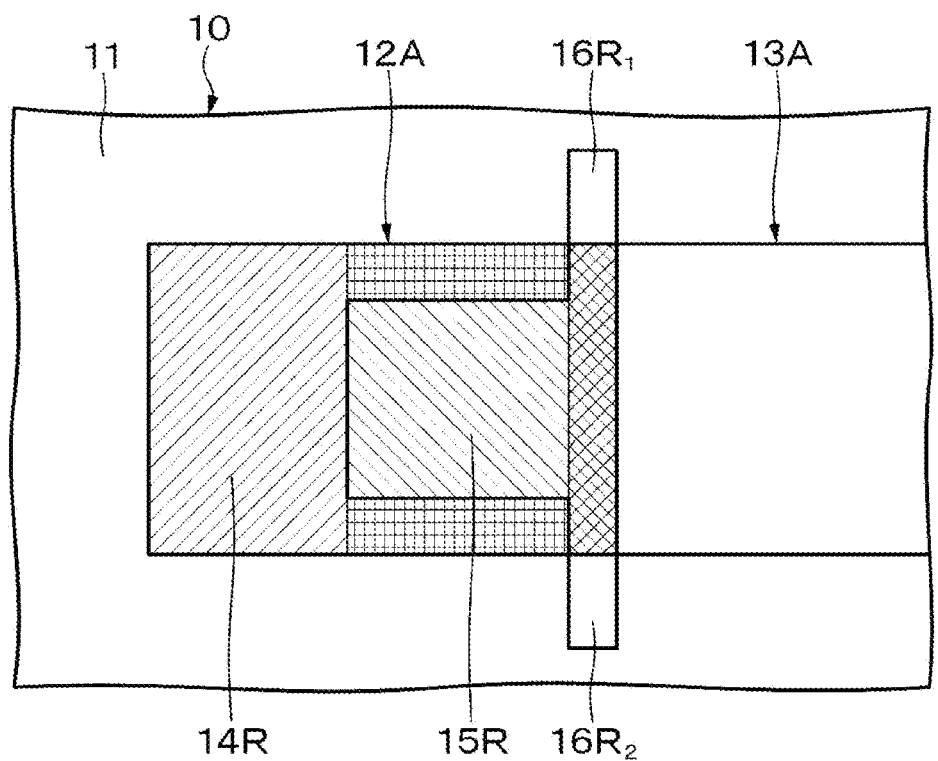
FIG. 4 is a plan view depicting an example of each region of a connection section.

The high-wettability region 14R is a region in which a surface of the high-wettability metallic layer 14 is exposed. As depicted in FIG. 4, the high-wettability region 14R has a region $R_A$ and a region $R_B$. The region $R_A$ and the region $R_B$ are connected to each other. The region $R_A$ and the region $R_B$, or the high-wettability region 14R, is a region in which the solders 21A and 21B are provided. In the first embodiment, a case where the solders 21A and 21B are provided in the region $R_B$ is described, but the solders 21A and 21B may not be provided in the region $R_B$.

The connection terminal 20A of the electronic component 20 is connected to the region $R_A$ of the connection section 12A, and the connection terminal 20B of the electronic component 20 is connected to the region $R_A$ of the connection section 12B. The connection terminal 20A of the electronic component 20 is fixed to the region $R_A$ of the connection section 12A by the solder 21A, and the connection terminal 20B of the electronic component 20 is fixed to the region $R_A$ of the connection section 12B by the solder 21B. The region $R_A$ and the region $R_B$ have, for example, a rectangular shape. The region $R_B$ may have a linear shape.

The region $R_A$ of the connection section 12A is provided on the side of the connection section 12A which is opposed to the connection section 12B. The region $R_A$ of the connection section 12B is provided on the side of the connection section 12B which is opposed to the connection section 12A. The region $R_B$ of the connection section 12A is provided along opposed peripheral edge portions (specifically, two opposed sides) of the connection section 12A. The region $R_B$ of the connection section 12B is provided along opposed peripheral edge portions (specifically, two opposed sides) of the connection section 12B.

(Low-Wettability Region)

The contact angle of the solder on the low-wettability region 15R is preferably equal to or more than 55 degrees. When the contact angle of the solder is substantially equal to or more than 55 degrees, a function excellent as the low-wettability region 15R can be obtained. The contact angle of the solder on the low-wettability region 15R is measured similarly to the contact angle of the solder on the high-wettability region 14R.

The low-wettability region 15R is a region in which a surface of the low-wettability metallic layer 15 is exposed from the high-wettability metallic layer 14. The low-wettability regions 15R of the connection sections 12A and 12B are opposed to each other. The low-wettability region 15R of the connection section 12A is opposed to the connection terminal 20A of the electronic component 20. The low-wettability region 15R of the connection section 12B is opposed to the connection terminal 20B of the electronic component 20.

In a manufacturing process, the low-wettability regions 15R prevent wetting spreading of the molten solders 21A and 21B and restrict the application positions of the solders 21A and 21B to fall within the high-wettability region 14R. The low-wettability regions 15R are regions in which the solders 21A and 21B are not provided, or regions in which the solders 21A and 21B are rarely provided. The low-wettability region 15R is a region in which the surface of the low-wettability metallic layer 15 is exposed. The wettability of the low-wettability region 15R is lower than the wettability of the high-wettability region 14R. Therefore, under the wettability on the low-wettability region 15R, the solders 21A and 21B are less likely to spread on the low-wettability region 15R than on the high-wettability region 14R.

As will be described later, the low-wettability region 15R is formed by removing part of the high-wettability metallic layer 14 provided on the low-wettability metallic layer 15. Part of the high-wettability metallic layer 14 may remain on a surface of the low-wettability metallic region 15R. At the surface of the low-wettability metallic region 15R, materials of the high-wettability metallic layer 14 and the low-wettability metallic layer 15 may form an alloy. In a case where the high-wettability metallic layer 14 contains gold (Au), the Au weight concentration percentage in the low-wettability region 15R is preferably equal to or less than 20%. When the Au weight concentration percentage is equal to or less than 20%, the wettability of the solders 21A and 21B in a molten state can be made sufficiently low. Therefore, a function sufficient as the low-wettability region 15R can be obtained.

The Au weight concentration percentage can be obtained by component analysis of the low-wettability region 15R by SEM-EDX (scanning electron microscope SU3500, made by Hitachi High-Tech Corporation: acceleration voltage of 15 kV).

As depicted in FIG. 4, the low-wettability region 15R has a region $R_C$ and a region $R_D$. The region $R_C$ and the region $R_D$ are connected to each other. The region $R_C$ has, for example, a rectangular shape. The region $R_D$ has, for example, a linear shape such as a rectilinear shape. In FIG. 4, an example in which the region $R_C$ has a rectilinear shape is depicted. The region $R_C$ is a spaced region that projects from the region $R_D$ toward the high-wettability region 14R (specifically, the region $R_A$ of the high-wettability region 14R) and is provided to be spaced from the opposed peripheral edge portions (specifically, the two opposed sides) of each of the connection sections 12A and 12B. Regions $R_B$ are provided on both sides of the region $R_C$ in a direction orthogonal to a projecting direction of the region $R_C$.

When the solders 21A and 21B are applied, the region $R_C$ becomes a region in which the application positions and the applying amounts of the solders 21A and 21B are allowed. In addition, when the applied solders 21A and 21B are melted, the region $R_C$ restricts the positions of the solders 21A and 21B. A width $W_C$ (see FIGS. 3A and 3B) of the region $R_C$ is preferably set such that the positional deviation and amount (size) of the applied solders 21A and 21B can be allowed and a desirable amount of solder is left in the region $R_A$ which is a soldering region. In order that the surface of the substrate main body 11 is not laser processed at the time of forming the region $R_C$, a width $W_B$ of the region $R_B$ is preferably set in consideration of the positional accuracy of the laser processing.

The region $R_D$ is a region that stops wetting spreading of the solders 21A and 21B at the time of melting of the solders 21A and 21B in the manufacturing process. The region $R_D$ is an extension region extended to the opposite peripheral edge portions (specifically, the two opposed sides) of each of the connection sections 12A and 12B. The region $R_D$ of the connection section 12A is provided on the depth side relative to the region $R_C$ as viewed from the connection terminal 20A of the electronic component 20. The region $R_D$ of the connection section 12B is provided on the depth side relative to the region $R_C$ as viewed from the connection terminal 20B of the electronic component 20.

A width $W_D$ of the region $R_D$ is preferably equal to or more than a minimum spot diameter of laser light but equal to or less than 15 μm, more preferably substantially equal to the minimum spot diameter of laser light. If the width $W_D$ of the region $R_D$ is less than the minimum spot diameter of laser light, it may be difficult to form the region $R_D$ by laser processing. On the other hand, when the width $W_D$ of the region $R_D$ is equal to or less than 15 μm, a size of laser processed regions $16R_1$ and $16R_2$ formed on the surface of the substrate main body 11 by laser processing in a forming step of the connection sections 12A and 12B can be reduced, so that lowering in the quality of soldering can be further prevented. When the width $W_D$ of the region $R_D$ is on the order of the minimum spot diameter of laser light, the size of the laser processed regions $16R_1$ and $16R_2$ formed on the surface of the substrate main body 11 by laser processing can be minimized. Therefore, lowering in the quality of soldering can be particularly prevented. The minimum spot diameter of laser light depends on the kind of the laser processing apparatus and is, for example, approximately 25 μm.

(Laser Processed Region)

The laser processed regions $16R_1$ and $16R_2$ are formed by laser processing in the forming step of the connection sections 12A and 12B. The laser processed regions $16R_1$ and $16R_2$ may not be provided, and, since it is difficult to laser process only the range of the region $R_D$ accurately, it is preferable that the laser processed regions $16R_1$ and $16R_2$ be provided. The laser processed region $16R_1$ is provided adjacent to one end of the region $R_D$, and the laser processed region $16R_1$ is provided adjacent to the other end of the region $R_D$. Peripheral edges of each of the connection sections 12A and 12B are located at the boundary between the laser processed region $16R_1$ and the region $R_D$. In addition, peripheral edges of each of the connection sections 12A and 12B are located at the boundary between the laser processed region $16R_2$ and the region $R_D$.

A width $W_E$ of the laser processed regions $16R_1$ and $16R_2$ in a projecting direction from the peripheral edge portions of each of the connection sections 12A and 12B is preferably set according to the processing position accuracy of laser. The width $W_E$ of the laser processed regions $16R_1$ and $16R_2$ may be equal to the width $W_B$ of the region $R_B$ ($W_E = W_E$).

(Conductor Pattern)

The conductor patterns 13A and 13B connect the electronic component 20 and other electronic components. The conductor patterns 13A and 13B are provided on the surface of the substrate main body 11. The conductor patterns 13A and 13B extend from the connection sections 12A and 12B, respectively. The conductor patterns 13A and 13B are what are generally called wires and have a linear shape.

The conductor patterns 13A and 13B may each include a high-wettability metallic layer 14 and a low-wettability metallic layer 15, like the connection sections 12A and 12B. The conductor patterns 13A and 13B may be integral with the connection sections 12A and 12B, respectively.

(Solder)

The solder 21A fixes the electronic component 20 to the connection section 12A. Specifically, the solder 21A fixes the connection terminal 20A of the electronic component 20 to the high-wettability region 14R of the connection section 12A. The solder 21B fixes the electronic component 20 to the connection section 12B. Specifically, the solder 21B fixes the connection terminal 20B of the electronic component 20 to the high-wettability region 14R of the connection section 12B. The solder 21A is provided in the high-wettability region 14R of the connection section 12A. The solder 21B is provided in the high-wettability region 14R of the connection section 12B. The solders 21A and 21B are, for example, solder pastes.

[Method of Manufacturing Electronic Component Mounted Body]

An example of a method of manufacturing the electronic component mounted body according to the first embodiment of the present disclosure will be described below with reference to FIGS. 5A to 5C and FIGS. 6A to 6C. Note that, in FIGS. 5A to 5C, a position P1 indicates a peripheral edge position of the low-wettability region 15R on the side far from the connection terminal 20A of the electronic component 20. In addition, in FIGS. 6A to 6C, a position P2 indicates a peripheral edge position of the low-wettability region 15R on the side near the connection terminal 20A of the electronic component 20.

First, a plurality of linear conductor patterns is formed on the surface of the substrate main body 11. The conductor pattern is a laminate of a low-wettability metallic layer 15 and a high-wettability metallic layer 14 provided on the low-wettability metallic layer 15. Next, an end part of the conductor pattern forming each of the connection sections 12A and 12B among the plurality of conductor patterns is laser processed, and part of the high-wettability metallic layer 14 is removed to expose the surface of the low-wettability metallic layer 15 having lower wettability than the high-wettability metallic layer 14. As a result, the connection sections 12A and 12B having the high-wettability region 14R in which the high-wettability metallic layer 14 is exposed and the low-wettability region 15R in which the low-wettability metallic layer 15 is exposed are formed on the electronic component mounting substrate 10.

Note that, in the case where the region $R_D$ of the low-wettability metallic layer 15 is formed by laser processing, it is preferable to form laser processed regions $16R_1$ and $16R_2$ by laser processing to a position exceeding both long sides of the conductor pattern, namely, to a position outside of the conductor pattern (the high-wettability metallic layer 14 and the low-wettability metallic layer 15). As a result, the region $R_D$ can be formed to positions of both long sides of the conductor pattern, even in the case where deviation from an ideal laser processing position is generated due to a limit of laser processing accuracy. Therefore, occurrence of defective formation of the region $R_D$ can be prevented.

Figure 5A:
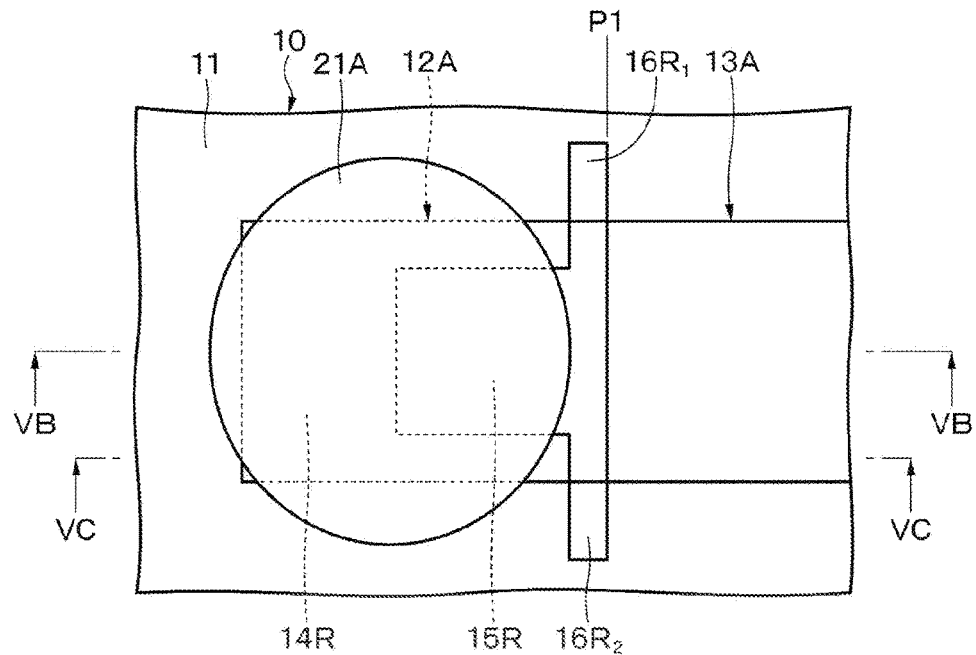
FIG. 5A is a plan view for explaining an example of a method of manufacturing the electronic component mounted body according to the first embodiment of the present disclosure.
Figure 5B:
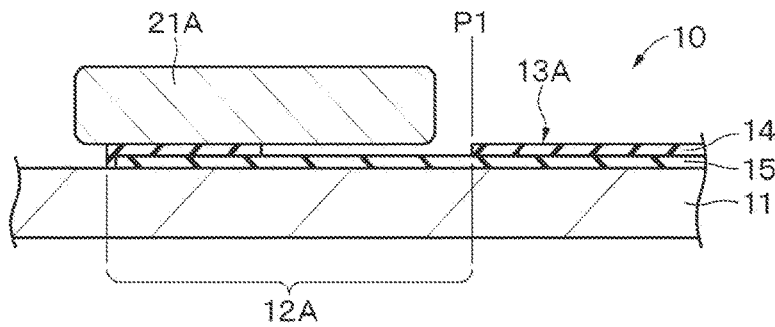
FIG. 5B is a sectional view taken along line VB-VB of FIG. 5A.
Figure 5C:
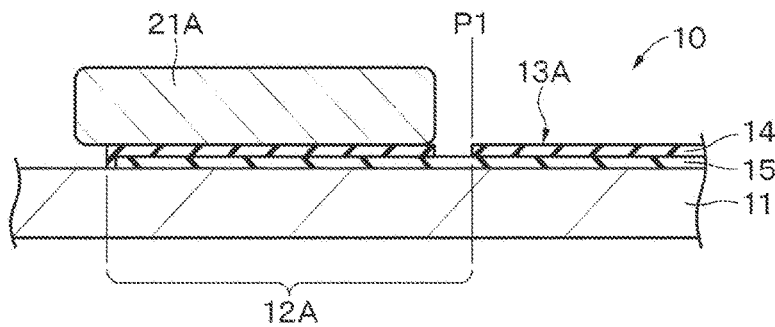
FIG. 5C is a sectional view taken along line VC-VC of FIG. 5A.

Next, as depicted in FIGS. 5A to 5C, the solders 21A and 21B are applied respectively to the connection sections 12A and 12B, and thereafter, the connection terminal 20A and the connection terminal 20B of the electronic component 20 are placed respectively on the solders 21A and 21B. In this instance, the solder 21A is applied to a position on the side of the connection terminal 20A of the electronic component 20 relative to the position P1. In addition, the solder 21B is applied to a position on the side of the connection terminal 20B of the electronic component 20 relative to the position P1.

Figure 6A:
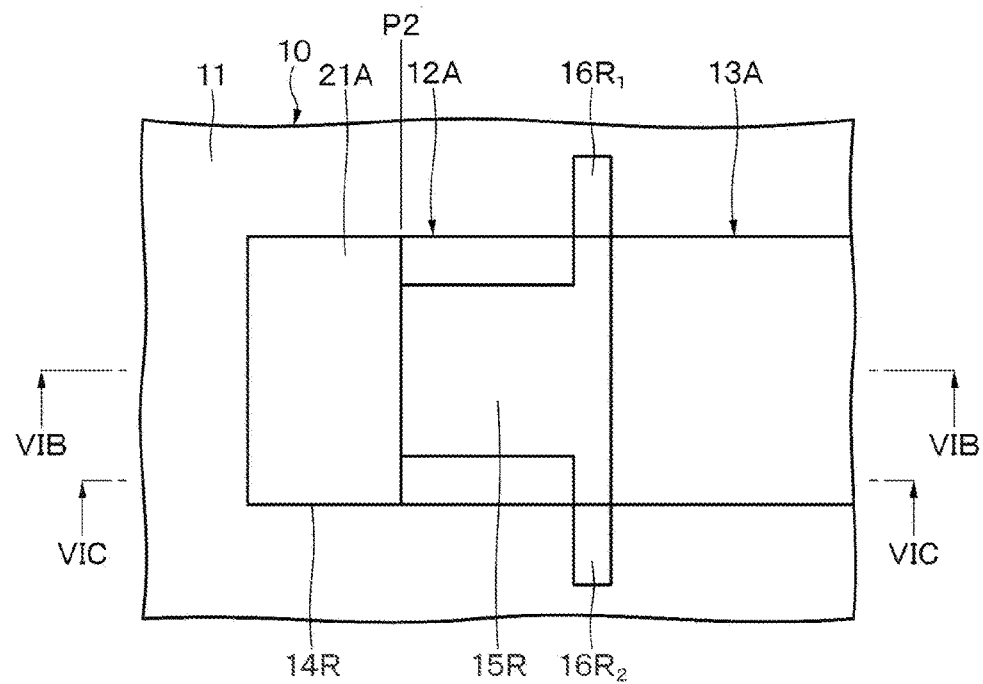
FIG. 6A is a plan view for explaining an example of the method for manufacturing the electronic component mounted body according to the first embodiment of the present disclosure.
Figure 6B:
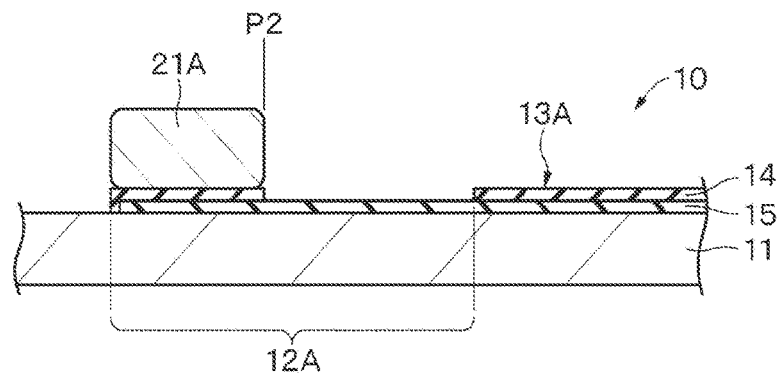
FIG. 6B is a sectional view taken along line VIB-VIB of FIG. 6A.
Figure 6C:
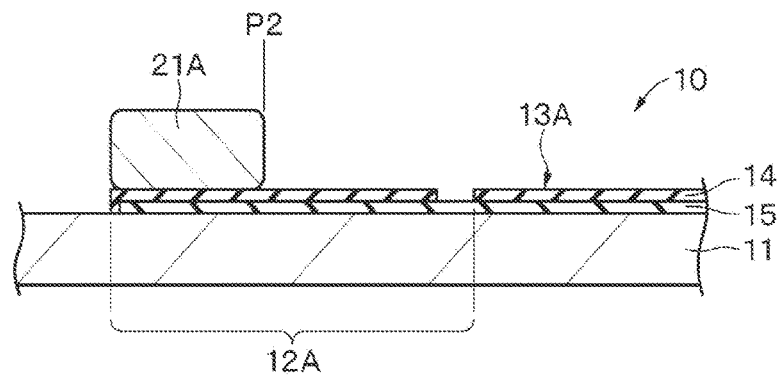
FIG. 6C is a sectional view taken along line VIC-VIC of FIG. 6A.

Subsequently, the solders 21A and 21B are melted by heating, for example, in a reflow furnace. The region $R_D$ can prevent the molten solders 21A and 21B from wetting and spreading to the conductor patterns 13A and 13B beyond the position P1. In addition, as depicted in FIGS. 6A to 6C, the region RC keeps the molten solders 21A and 21B remaining closer to the side of the electronic component 20 relative to the position P2, and the positions of the solders 21A and 21B are restricted. Note that, in FIGS. 6A to 6C, illustration of the connection terminal 20A is omitted. The method for melting the solders 21A and 21B by heating is not limited to the reflow furnace, and local heating by irradiation with laser light or other heating methods may be adopted.

When the solder 21A or 21B is melted, the molten solder 21A or 21B is collected in the region $R_A$, due to the difference in surface tension of the molten solder 21A or 21B caused by the size difference between the region $R_A$ and the region $R_B$. While the molten solders 21A and 21B wet and spread into the region $R_B$, the molten solders 21A and 21B wetting and spreading into the region $R_B$ are sufficiently small in height. Therefore, most of the applied solders 21A and 21B can be kept remaining in the region $R_A$. In the abovementioned manner, the desired electronic component mounted body 1 can be obtained.

Advantageous Effects

As described above, in the electronic component mounted body 1 according to the first embodiment, the low-wettability region 15R has the region $R_D$ extended to the opposed peripheral edge portions (specifically, the two opposed sides) of each of the connection sections 12A and 12B, and the region $R_C$ that projects from the region $R_D$ toward the high-wettability region 14R and is provided to be spaced from the opposed peripheral edge portions (specifically, the two opposed sides) of each of the connection sections 12A and 12B. As a result, (1) at the time of forming the low-wettability region 15R by laser processing, even in the case where deviation from an ideal laser processing position is generated due to a limit of laser processing accuracy, a region in which the surface of the substrate main body 11 is processed can be reduced. Therefore, at the time of applying the solders 21A and 21B such as solder pastes, a solvent component including a flux can be prevented from flowing into the laser processing region by capillary phenomenon. (2) In addition, even in the case where deviation is generated in the application positions of the solders 21A and 21B such as solder pastes, most of the molten solders 21A and 21B can be kept remaining in the region $R_A$ by the region $R_C$ of the low-wettability region 15R (see FIGS. 5A to 5C and FIGS. 6A to 6C). Therefore, an allowable range for the application position deviation of the solders 21A and 21B can be widened. As a result of (1) and (2) above, lowering in the quality of soldering can be prevented.

In addition, in the manufacturing process, the region $R_C$ of the low-wettability region 15R can prevent the wetting and spreading of the molten solders 21A and 21B, and with the presence of the region $R_C$, it is possible to supply a suitable amount of solder to the soldering region $R_A$ according to the shape and size and the like of the electronic component 20. Therefore, a favorable filet shape can be formed, and shock resistance of the electronic component mounted body 1 can be enhanced. Accordingly, long-term reliability of the electronic component mounted body 1 can be enhanced.

In the case of only surface layer wiring, wetting and spreading of solder cannot be prevented, so that reduction in the pitch of the connection terminals of the electronic component and reduction in size of the electronic component are difficult to be achieved. On the other hand, in the electronic component mounted body 1 according to the first embodiment, the positions and amounts of the molten solders 21A and 21B can be restricted by the low-wettability region 15R, so that reduction in the pitch of the connection terminals 20A, 20B of the electronic component 20 and reduction in size of the electronic component 20 are possible. Therefore, the electronic component mounted body 1 can be enhanced in density.

2 Second Embodiment

[Configuration of Electronic Component Mounted Body]

Figure 7A:
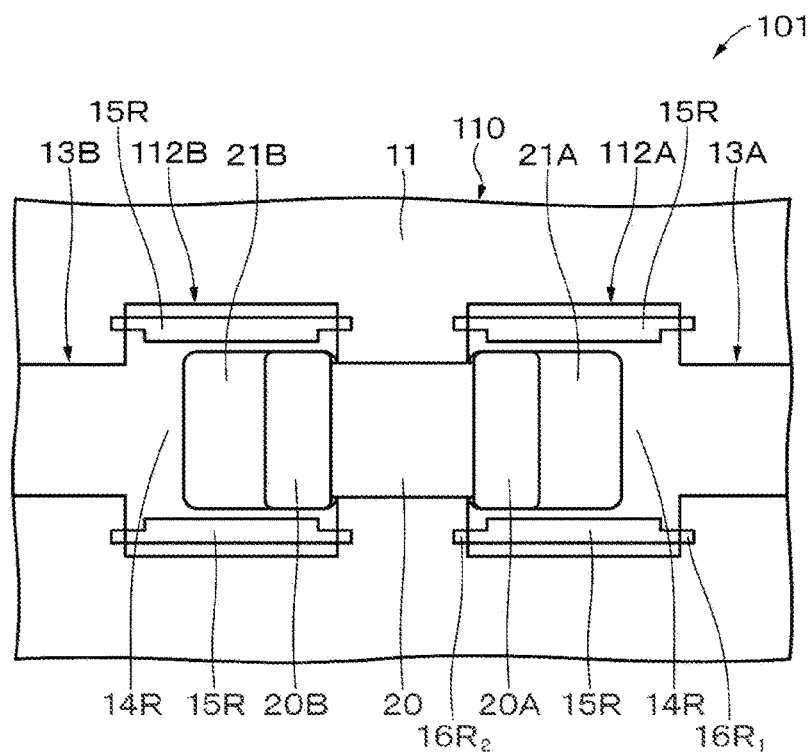
FIG. 7A is a plan view depicting an example of a configuration of an electronic component mounted body according to a second embodiment of the present disclosure.
Figure 7B:
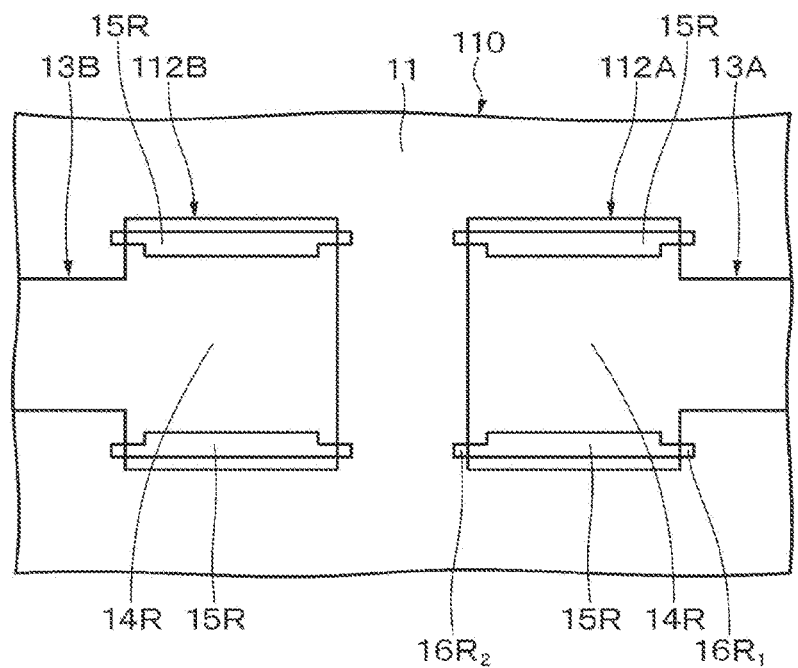
FIG. 7B is a plan view depicting an example of a configuration of an electronic component mounting substrate.

FIG. 7A is a plan view depicting an example of a configuration of an electronic component mounted body 101 according to a second embodiment of the present disclosure. FIG. 7B is a plan view depicting an example of a configuration of an electronic component mounting substrate 110. The electronic component mounted body 101 differs from the electronic component mounted body 1 according to the first embodiment in that the electronic component mounting substrate 110 includes connection sections 112A and 112B in place of the connection sections 12A and 12B.

The connection sections 112A and 112B each have a high-wettability region 14R and a pair of low-wettability regions 15R. Widths of the connection sections 112A and 112B are wider than the widths of the conductor patterns 13A and 13B, respectively. As a result, the spot of laser light to be used for melting the solders 21A and 21B can be accommodated in the connection sections 112A and 112B. Therefore, at the time of locally heating the solders 21A and 21B by irradiation with laser light, a situation in which the spot of the laser light gets out of the connection sections 12A and 12B and is applied directly to the surface of the substrate main body 11 can be prevented. Therefore, a situation in which resin contained in the surface of the substrate main body 11 is melted and the quality of soldering is lowered can be prevented.

Figure 8:
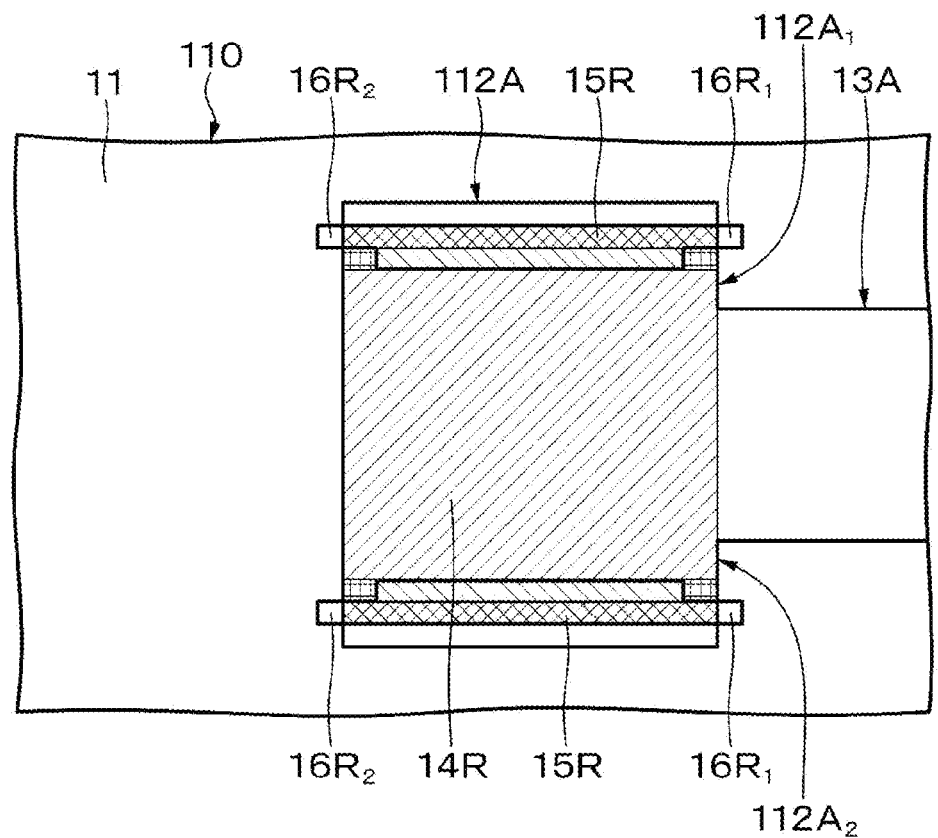
FIG. 8 is a plan view depicting an example of each region of a connection section.

FIG. 8 is a plan view depicting an example of each region of the connection section 112A. The connection section 112A has projecting sections $112A_1$ and $112A_2$ projecting relative to both long sides of the conductor pattern 13B. The two low-wettability regions 15R are provided on the projecting sections $112A_1$ and $112A_2$, respectively. The high-wettability region 14R is provided between the two low-wettability regions 15R. The two low-wettability regions 15R face each other, with the high-wettability region 14R interposed therebetween. The connection section 112B has each region similarly to the connection section 112A.

In the electronic component mounted body 101 having the abovementioned configuration, the connection terminals 20A and 20B of the electronic component 20 are connected respectively to the connection sections 112A and 112B in the following manner. The connection terminal 20A of the electronic component 20 and the solder 21A are disposed in the high-wettability region 14R of the connection section 112A, and the connection terminal 20B of the electronic component 20 and the solder 21B are disposed in the high-wettability region 14R of the connection section 112B. The solders 21A and 21B are melted by irradiation with laser light and are solidified.

Advantageous Effects

Figure 9A:
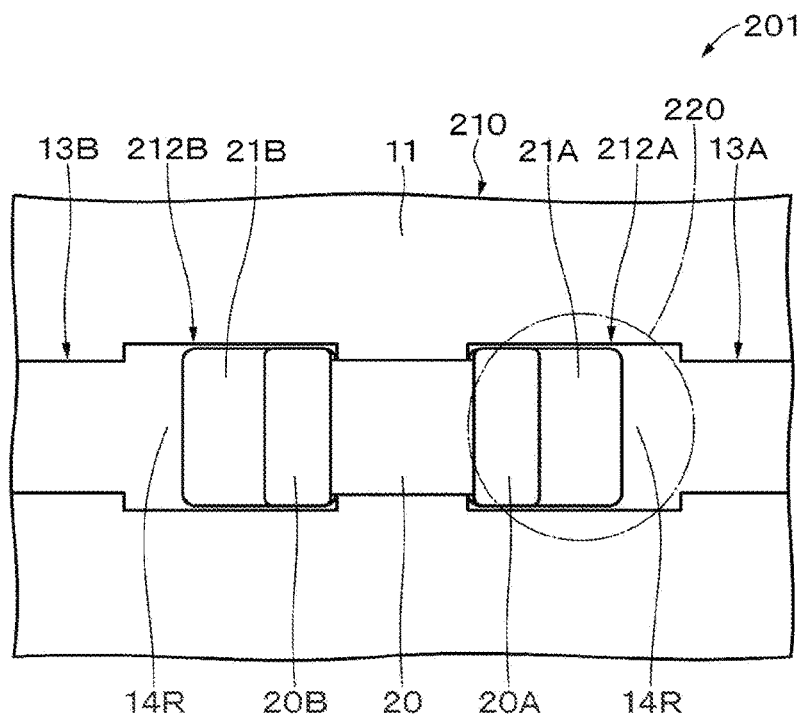
FIG. 9A is a plan view depicting a configuration of an electronic component mounted body according to Reference Example 1.

FIG. 9A is a plan view depicting a configuration of an electronic component mounted body 201 according to Reference Example 1. The electronic component mounted body 201 differs from the electronic component mounted body 101 according to the second embodiment in that each width of connection sections 212A and 212B is substantially the same as the width of the conductor patterns 13A and 13B and that the connection sections 212A and 212B do not have the two low-wettability regions 15R.

In the electronic component mounted body 201 having the abovementioned configuration, at the time of heating the solders 21A and 21B by laser light, in the manufacturing process, a spot 220 of the laser light may get out of the connection sections 112A and 112B, as depicted in FIG. 9A, and the laser light may be applied directly to a ground resin, so that the resin contained in the substrate main body 11 may be melted.

Figure 9B:
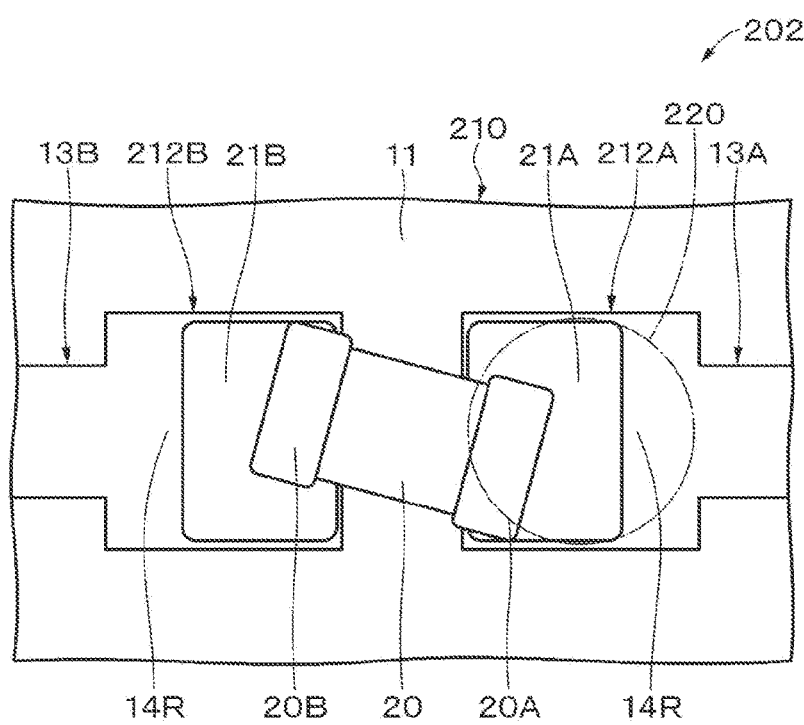
FIG. 9B is a plan view depicting the configuration of an electronic component mounted body according to Reference Example 2.

FIG. 9B is a plan view depicting a configuration of an electronic component mounted body 202 according to Reference Example 2. In the electronic component mounted body 202, for preventing the abovementioned melting of the resin, the size of the connection sections 212A and 212B is enlarged such that the spot 220 of laser light falls within the connection sections 212A and 212B. However, when the size of the connection sections 212A and 212B is thus enlarged, the molten solders 21A and 21B wet and spread on the connection sections 212A and 212B, as depicted in FIG. 9B, so that the electronic component 20 may be moved from a prescribed position due to rotation or the like, and soldering may be difficult to be performed.

In the electronic component mounted body 201 according to the second embodiment, the projecting sections $112A_1$ and $112A_2$ are provided, whereby the size of the connection sections 212A and 212B is enlarged, and the pair of low-wettability regions 15R face each other, with the high low-wettability region 15R interposed therebetween. Therefore, the spot 220 of laser light can be prevented from getting out of the connection sections 112A and 112B, and, in the manufacturing process, the molten solders 21A and 21B can be restricted from two sides. Accordingly, lowering in the quality of soldering due to melting of the resin can be prevented, and positional deviation of the electronic component 20 from the prescribed position can be prevented.

3 Third Embodiment

[Configuration of Electronic Component Mounted Body]

Figure 10A:
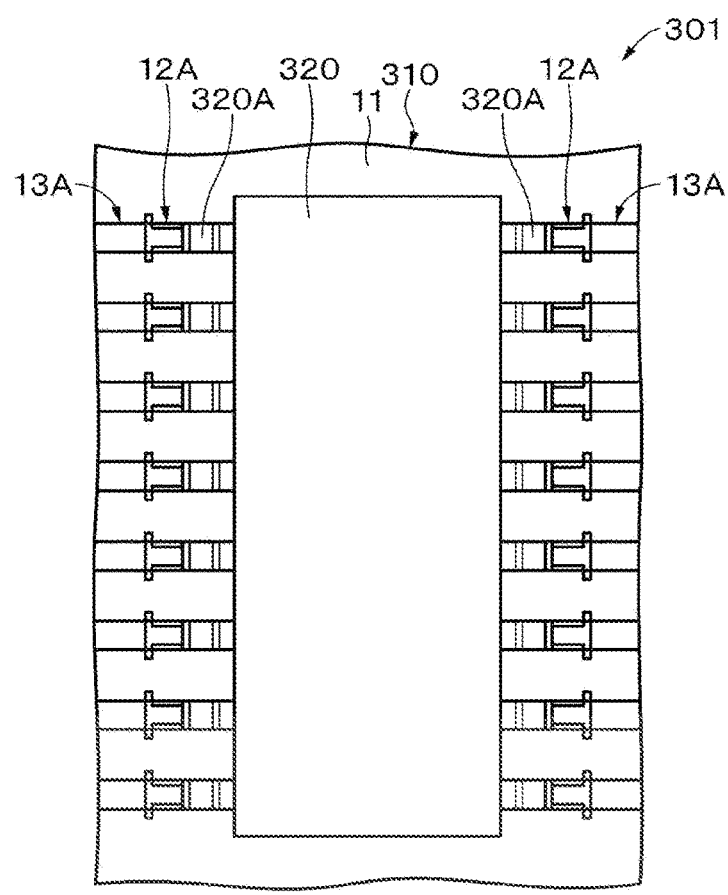
FIG. 10A is a plan view depicting an example of a configuration of an electronic component mounted body according to a third embodiment of the present disclosure.
Figure 10B:
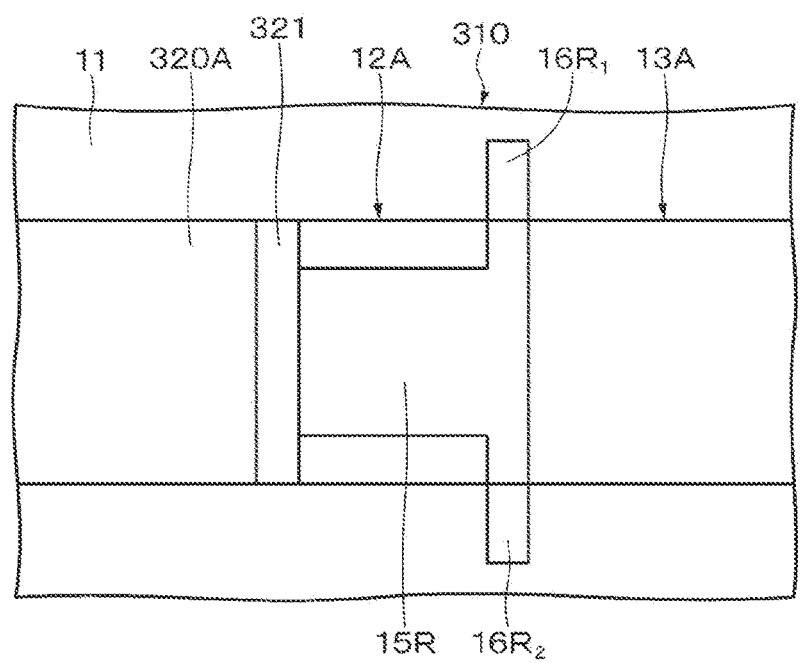
FIG. 10B is a plan view depicting, in an enlarged manner, a part of FIG. 10A.

FIG. 10A is a plan view depicting an example of a configuration of an electronic component mounted body 301 according to a third embodiment of the present disclosure. FIG. 10B is a plan view depicting, in an enlarged manner, a part of FIG. 10A. The electronic component mounted body 301 includes an electronic component mounting substrate 310, an electronic component 320, and a plurality of solders 321. Note that the parts in the third embodiment that are similar to those in the first embodiment above are denoted by the same reference signs as used above, and descriptions thereof are omitted.

(Electronic Component)

The electronic component 320 has a chip-like shape. The electronic component 320 includes a plurality of connection terminals 320A. Examples of the electronic component include an IC (Integrated Circuit), a CPU (Central Processing Unit), an image sensor, or the like, but the electronic component is not limited to these electronic components. In FIG. 10A, an example in which the electronic component 320 is an IC is depicted.

(Solder)

The solders 321 are similar to the solders 21A and 21B in the first embodiment.

(Electronic Component Mounting Substrate)

The electronic component mounting substrate 310 differs from the electronic component mounting substrate 10 according to the first embodiment in that it includes a plurality of connection sections 12A the number of which accords to the plurality of connection terminals 320A included in the electronic component 320.

Advantageous Effects

In the electronic component mounted body 301 according to the third embodiment, the electronic component mounting substrate 310 includes a plurality of connection terminals 320A having a high-wettability region 14R and a low-wettability region 15R. Therefore, advantageous effects similar to those of the electronic component mounted body 1 according to the first embodiment can be obtained.

4 Modifications

[Modification 1]

Figure 11:
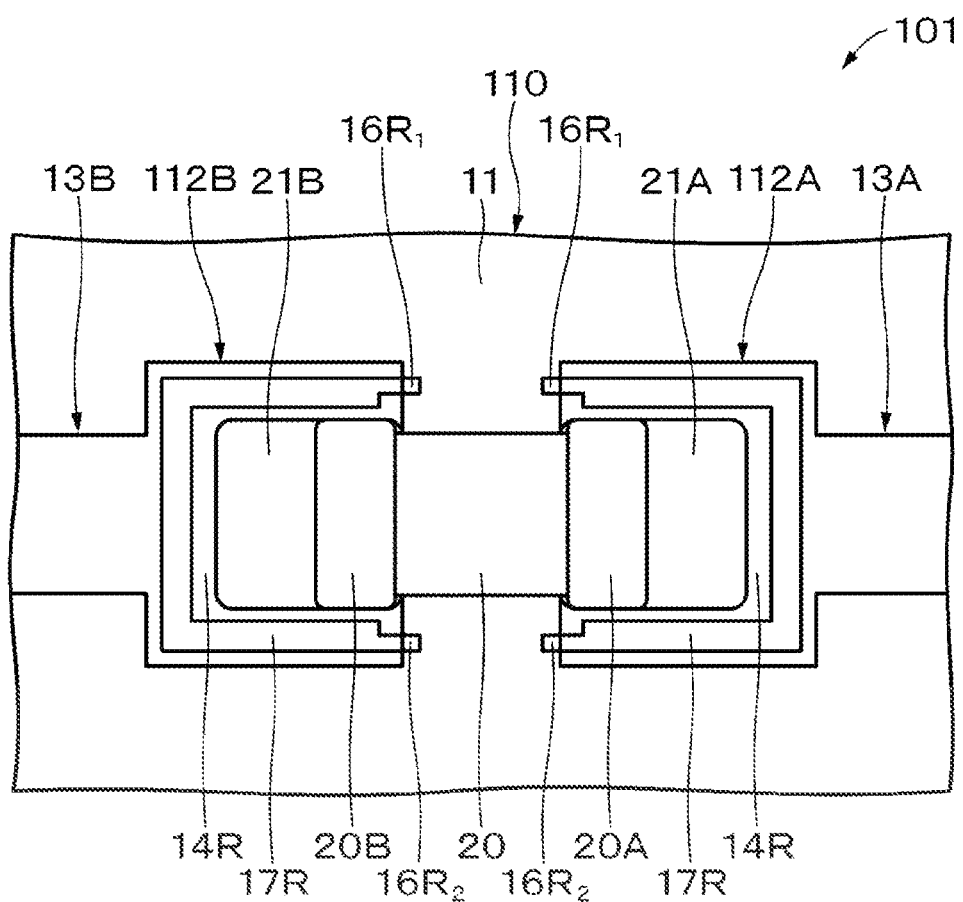
FIG. 11 is a plan view depicting an example of a configuration of an electronic component mounted body according to a modification.

In the abovementioned second embodiment, a case where the connection sections 112A and 112B have a pair of low-wettability regions 15R and where the pair of low-wettability regions 15R restrict the high-wettability region 14R in such a manner as to interpose the high-wettability region 14R therebetween has been described, but the configuration of the connection sections 112A and 112B is not limited to this. For example, as depicted in FIG. 11, the connection sections 112A and 112B may have one low-wettability region 17R having a roughly U-shape, and the one low-wettability region 17R may restrict the high-wettability region 14R in such a manner as to surround the high-wettability region 14R from three directions. Here, the roughly U-shape means a shape when the connection sections 112A and 112B are seen, in plan view, from a direction perpendicular to a surface of the electronic component mounting substrate 110.

A peripheral edge portion of the connection section 112A which is on the side facing the connection section 112B is not surrounded by the low-wettability region 17R and is opened. Similarly, a peripheral edge portion of the connection section 112B which is on the side facing the connection section 112A is not surrounded by the low-wettability region 17R and is opened. A tip of the low-wettability region 17R of the connection section 112A is extended to a peripheral edge of the connection section 112A on the side facing the connection section 112B. Similarly, a tip of the low-wettability region 17R of the connection section 112B is extended to a peripheral edge of the connection section 112B on the side facing the connection section 112A.

In the electronic component mounted body 101 having the abovementioned configuration, the molten solders 21A and 21B can be restricted in the three directions in the manufacturing process, so that the solders 21A and 21B can be prevented from wetting and spreading on the conductor patterns 13A and 13B, respectively. As a result, prescribed amounts of the solders 21A and 21B can be held on the connection sections 112A and 112B, respectively, so that a favorable filet shape can be formed. Therefore, shock resistance of the electronic component mounted body 101 can be enhanced. Accordingly, long-term reliability of the electronic component mounted body 101 can be enhanced. In addition, the electronic component 20 can be prevented from being positionally deviated in a direction in which the connection sections 112A and 112B are disposed.

Note that the connection sections 112A and 112B may each have three low-wettability regions 15R, and the three low-wettability regions 15R may restrict the high-wettability region 14R in such a manner as to surround the high-wettability region 14R from three directions.

[Modification 2]

In the abovementioned second embodiment, a case where the two low-wettability regions 15R are provided to be spaced from each other in a direction orthogonal to the direction in which the connection sections 112A and 112B are disposed and where the high-wettability region 14R is interposed between these two low-wettability regions 15R has been described, but also adoptable is a configuration in which two low-wettability regions 15R are provided to be spaced from each other in the direction in which the connection sections 112A and 112B are disposed and the high-wettability region 14R is interposed between these two low-wettability regions 15R.

[Modification 3]

In the abovementioned first to third embodiments, a case where the region $R_D$ has a rectilinear shape has been described, but the shape of the region $R_D$ is not limited to this and may have an arch shape, a V shape, a polygonal line shape, a tortuous shape, a meandering shape, or the like.

5 Application Examples

Any one of the electronic component mounted bodies 1, 101, and 301 according to the first to third embodiments and their modifications may be provided in an electronic apparatus. Examples of the electronic apparatus including any one of the electronic component mounted bodies 1, 101, and 301 include personal computers, mobile apparatuses, mobile phones, tablet type computers, display devices, imaging devices, audio apparatuses, game apparatuses, medical apparatuses, industrial equipment, robots, or the like, but these are not limitative.

While the embodiments of the present disclosure and modifications have been described specifically, the present disclosure is not limited to the above embodiments and modifications and may be variously modified on the basis of the technical thought of the present disclosure.

For example, the configurations, method, steps, shapes, materials, numerical values, and the like mentioned in the above embodiments and modifications are merely examples, and configurations, method, steps, shapes, materials, numerical values, and the like different from these may be used as required.

The configurations, method, steps, shapes, materials, numerical values, and the like of the above embodiments and modifications can be combined with one another insofar as the combination does not depart from the gist of the present disclosure.

In the numerical value ranges described stepwise in the above embodiments and modifications, the upper limit or the lower limit in the numerical value range at a certain stage may be replaced by the upper limit or the lower limit in the numerical value range at other stage.

The material exemplified in the above embodiments and modifications can be used either singly or in combination of two or more, unless specified otherwise.

In addition, the present disclosure may also adopt the following configurations.

(1)

An electronic component mounted body including:
a substrate;
a connection section provided on the substrate;
an electronic component having a terminal connected to the connection section; and
a solder that fixes the electronic component to the connection section,
in which the connection section has
a first region in which the terminal is fixed by the solder, and
a second region lower in wettability than the first region, and
the second region has
an extension region extended to a peripheral edge of the connection section, and
a spaced region that projects from the extension region toward the first region and that is provided to be spaced from the peripheral edge.

(2)

The electronic component mounted body as described in (1),
in which the connection section has
a first metallic layer, and
a second metallic layer that is provided under the first metallic layer and that is lower in wettability than the first metallic layer,
the first region includes a region in which a surface of the first metallic layer is exposed, and
the second region includes a region in which a surface of the second metallic layer is exposed.

(3)

The electronic component mounted body as described in (1) or (2), including:
a pair of the connection sections,
in which the first regions of the pair of the connection sections face each other.

(4)

The electronic component mounted body as described in any one of (1) to (3),
in which the connection section has a pair of the second regions, and
the pair of the second regions face each other, with the first region interposed therebetween.

(5)

The electronic component mounted body as described in any one of (1) to (3),
in which the second region surrounds the first region from three directions.

(6)

The electronic component mounted body as described in any one of (1) to (4),
in which the substrate includes a resin molded body.

(7)

The electronic component mounted body as described in any of (1) to (6),
in which a surface of the substrate is provided with a laser processed region adjacent to the extension region.

(8)

The electronic component mounted body as described in any one of (1) to (7), further including:
a conductor pattern extended from the connection section.

(9)

An electronic apparatus including:
an electronic component mounted body as described in any one of (1) to (8).

(10)

An electronic component mounting substrate including:
a substrate; and
a connection section provided on the substrate,
in which the connection section has
a first region, and
a second region lower in wettability than the first region, and
the second region has
an extension region extended to a peripheral edge of the connection section, and
a spaced region that projects from the extension region toward the first region and that is provided to be spaced from the peripheral edge.

(11)
A method of manufacturing an electronic component mounted body, the method including:
  removing part of a first metallic layer by laser processing to expose a second metallic layer lower in wettability than the first metallic layer, thereby forming, on a substrate, a connection section that has a first region in which the first metallic layer is exposed and a second region in which the second metallic layer is exposed,
  in which the second region has
    an extension region extended to a peripheral edge of the connection section, and
    a spaced region that projects from the extension region toward the first region and that is provided to be spaced from the peripheral edge.

(12)
The method of manufacturing an electronic component mounted body as described in (11),
  in which, at a time of forming the extension region by the laser processing, the laser processing is performed to a position outside the first metallic layer and the second metallic layer.

(13)
The method of manufacturing an electronic component mounted body as described in (11) or (12),
  in which a width of the extension region is substantially equal to a spot diameter of laser light to be used in the laser processing.

(14)
The method of manufacturing an electronic component mounted body as described in any of (1) to (13), further including:
  disposing a connection terminal of an electronic component and a solder in the first region, and melting the solder by irradiation with laser light.

(15)
The method of manufacturing an electronic component mounted body as described in (14),
  in which a spot of the laser light to be used for melting the solder falls within the connection section.

REFERENCE SIGN LIST 1, 101, 201, 301: Electronic component mounted substrate
10, 110, 210, 310: Electronic component mounting substrate
11: Substrate main body
12A and 12B, 112A and 112B, 212A, 212B: Connection section
13A and 13B: Conductor pattern
14: High-wettability metallic layer (First conduction layer)
15: Low-wettability metallic layer (Second conduction layer)
14R: High-wettability region (First region)
15R, 17R: Low-wettability region (Second region)
$16R_1$, $16R_2$: Laser processing region
20, 320: Electronic component
20A, 20B, 320: Terminal
320A: Terminal
21A and 21B, 321: Solder
$112A_1$, $112A_2$: Projecting section

The invention claimed is:
1. An electronic component mounted body, comprising:
  a substrate;
  a connection section provided on the substrate;
  an electronic component having a terminal connected to the connection section; and
  a solder that fixes the electronic component to the connection section,
  wherein the connection section comprises:
    a first region in which the terminal is fixed by the solder; and
    a second region lower in wettability than the first region,
  wherein the second region comprises:
    an extension region extended to a peripheral edge of the connection section; and
    a spaced region that projects from the extension region toward the first region and that is provided to be spaced from the peripheral edge,
    wherein a surface of the substrate is provided with a laser processed region adjacent to the extension region, and
    wherein a width of the laser processed region is equal to a width of the extension region.

2. The electronic component mounted body according to claim 1, wherein the connection section comprises:
  a first metallic layer; and
  a second metallic layer that is provided under the first metallic layer and that is lower in wettability than the first metallic layer,
  wherein the first region includes a region in which a surface of the first metallic layer is exposed, and
  wherein the second region includes a region in which a surface of the second metallic layer is exposed.

3. The electronic component mounted body according to claim 1, comprising a pair of the connection sections, wherein the first regions of the pair of the connection sections face each other.

4. The electronic component mounted body according to claim 1, wherein the connection section has a pair of the second regions, and wherein the pair of the second regions face each other, with the first region interposed therebetween.

5. The electronic component mounted body according to claim 1, wherein the second region surrounds the first region from three directions.

6. The electronic component mounted body according to claim 1, wherein the substrate includes a resin molded body.

7. The electronic component mounted body according to claim 1, further comprising a conductor pattern extended from the connection section.

8. The electronic component mounted body according to claim 7, wherein the conductor pattern has a same width as the first region of the connection section.

9. An electronic apparatus, comprising:
  a housing; and
  an electronic component mounted body provided within the housing
  according to claim 1.

10. An electronic component mounting substrate, comprising:
  a substrate; and
  a connection section provided on the substrate,
  wherein the connection section comprises:
    a first region; and
    a second region lower in wettability than the first region,
  wherein the second region comprises:
    an extension region extended to a peripheral edge of the connection section; and a spaced region that projects from the extension region toward the first region and that is provided to be spaced from the peripheral edge, wherein a surface of the substrate is provided with a laser processed region adjacent to the extension region, and wherein a width of the laser processed region is equal to a width of the extension region.

11. The electronic component mounting substrate according to claim 10, wherein the connection section comprises:
a first metallic layer; and
a second metallic layer that is provided under the first metallic layer and that is lower in wettability than the first metallic layer,
wherein the first region includes a region in which a surface of the first metallic layer is exposed, and
wherein the second region includes a region in which a surface of the second metallic layer is exposed.

12. The electronic component mounting substrate according to claim 10, comprising a pair of the connection sections, wherein the first regions of the pair of the connection sections face each other.

13. The electronic component mounting substrate according to claim 10, wherein the connection section has a pair of the second regions, and wherein the pair of the second regions face each other, with the first region interposed therebetween.

14. The electronic component mounting substrate according to claim 10, wherein the substrate includes a resin molded body.

15. The electronic component mounting substrate according to claim 10, further comprising a conductor pattern extended from the connection section.

16. The electronic component mounting substrate according to claim 15, wherein the conductor pattern has a same width as the first region of the connection section.

17. A method of manufacturing an electronic component mounted body, the method comprising:

removing part of a first metallic layer by laser processing to expose a second metallic layer lower in wettability than the first metallic layer, thereby forming, on a substrate, a connection section that has a first region in which the first metallic layer is exposed and a second region in which the second metallic layer is exposed, wherein the second region comprises:
an extension region extended to a peripheral edge of the connection section; and
a spaced region that projects from the extension region toward the first region and that is provided to be spaced from the peripheral edge,
wherein a surface of the substrate is provided with a laser processed region adjacent to the extension region, and
wherein a width of the laser processed region is equal to a width of the extension region.

18. The method of manufacturing an electronic component mounted body according to claim 17, wherein, at a time of forming the extension region by the laser processing, the laser processing is performed to a position outside the first metallic layer and the second metallic layer.

19. The method of manufacturing an electronic component mounted body according to claim 17, further comprising disposing a connection terminal of an electronic component and a solder in the first region, and melting the solder by irradiation with laser light.

20. The method of manufacturing an electronic component mounted body according to claim 19, wherein a spot of the laser light to be used for melting the solder falls within the connection section.

* * * * *